United States Patent
Lan et al.

(10) Patent No.: US 10,705,420 B2
(45) Date of Patent: Jul. 7, 2020

(54) MASK BIAS APPROXIMATION

(71) Applicant: ASML US, LLC, Chandler, AZ (US)

(72) Inventors: Song Lan, San Jose, CA (US); Ke Zhao, San Jose, CA (US); Yang Cao, San Jose, CA (US); Jihui Huang, San Jose, CA (US)

(73) Assignee: ASML US, LLC, Chandler, AZ (US)

( * ) Notice: Subject to any disclaimer, the term of this patent is extended or adjusted under 35 U.S.C. 154(b) by 0 days.

(21) Appl. No.: 15/979,751

(22) Filed: May 15, 2018

(65) Prior Publication Data

US 2019/0354005 A1    Nov. 21, 2019

(51) Int. Cl.
| | |
|---|---|
| G06F 17/50 | (2006.01) |
| G03F 1/70 | (2012.01) |
| G03F 1/36 | (2012.01) |
| G03F 1/20 | (2012.01) |
| G06T 7/00 | (2017.01) |

(52) U.S. Cl.
CPC .................. *G03F 1/70* (2013.01); *G03F 1/20* (2013.01); *G03F 1/36* (2013.01); *G06T 7/0006* (2013.01); *G06T 2207/30148* (2013.01)

(58) Field of Classification Search
CPC .................. G03F 1/70; G03F 1/20; G03F 1/36
USPC .......................................................... 716/54
See application file for complete search history.

(56) References Cited

U.S. PATENT DOCUMENTS

| | | | |
|---|---|---|---|
| 2009/0157360 A1* | 6/2009 | Ye ........................... | G03F 7/705 703/2 |
| 2009/0162197 A1* | 6/2009 | Klemo .................. | F04D 25/088 416/1 |
| 2009/0180711 A1* | 7/2009 | Lavin ........................ | G03F 1/36 382/283 |
| 2010/0119961 A1* | 5/2010 | Ye ........................... | G03F 1/144 430/30 |
| 2011/0116067 A1* | 5/2011 | Ye ....................... | G03F 7/70091 355/67 |

* cited by examiner

*Primary Examiner* — Suchin Parihar
(74) *Attorney, Agent, or Firm* — Pillsbury Winthrop Shaw Pittman LLP

(57) ABSTRACT

Directly biasing a mask image is disclosed. A method includes generating a mask image for the mask, biasing the mask image to obtain a biased mask image, and simulating the biased mask image to obtain a wafer image to be compared to the design pattern. Biasing the mask image includes updating at least one pixel of the mask image using an interpolation of neighboring pixels of the at least one pixel, the interpolation being dependent on a predetermined value.

20 Claims, 6 Drawing Sheets

MASK BIAS APPROXIMATION

TECHNICAL FIELD

This disclosure relates to mask making for manufacturing integrated circuits (ICs). More specifically, this disclosure relates to obtaining an optimized mask by approximating a mask bias in the mask optimization process.

BACKGROUND

In semiconductor manufacturing, charged particle beams have been widely used to make high-precision masks. For example, mask makers (or "mask writers") can use electron beams ("ebeams" or simply "beams") to transfer design patterns onto masks (referred to as "mask patterns" or "mask shapes"). Software tools have been used to create and optimize the design patterns to fulfill design objectives. The mask patterns are transferred onto a substrate (e.g., a wafer) by a lithography process. The substrate with transferred patterns (referred to as "substrate patterns") can be treated by following mechanical and chemical processes for manufacturing ICs. The design of the mask can significantly affect the quality of the resulting manufactured ICs. Therefore, it is desirable to produce mask patterns (i.e., an optimized mask) that eliminate (or, at least, significantly reduce) differences between the design patterns and the manufactured ICs. Obtaining an optimized mask is a lengthy process. A need exists for shortening the process of obtaining an optimized mask.

SUMMARY

Disclosed herein are methods, apparatuses, and systems for application of mask bias approximation.

In an aspect, a method of optimizing a mask used to produce a design pattern by an ebeam includes generating a mask image for the mask, biasing the mask image to obtain a biased mask image, and simulating the biased mask image to obtain a wafer image to be compared to the design pattern. Biasing the mask image includes updating at least one pixel of the mask image using an interpolation of neighboring pixels of the at least one pixel, the interpolation being dependent on a predetermined value.

In another aspect, an apparatus for optimizing a mask used to produce a design pattern by an ebeam is disclosed. The apparatus includes a processor and a memory configured to store instructions executable by the processor to generate a mask image for the mask, bias the mask image to obtain a biased mask image, and simulate the biased mask image to obtain a wafer image to be compared to the design pattern. Biasing the mask image includes updating at least one pixel of the mask image using an interpolation of neighboring pixels of the at least one pixel, the interpolation being dependent on a predetermined value.

In another aspect, a non-transitory computer-readable storage medium for optimizing a mask used to produce a design pattern by an ebeam is disclosed. The non-transitory computer-readable storage medium includes instructions, which instructions when executed by a processor become operational with the processor to generate a mask image for the mask, bias the mask image to obtain a biased mask image, and simulate the biased mask image to obtain a wafer image to be compared to the design pattern. Biasing the mask image includes updating at least one pixel of the mask image using an interpolation of neighboring pixels of the at least one pixel, the interpolation being dependent on a predetermined value.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
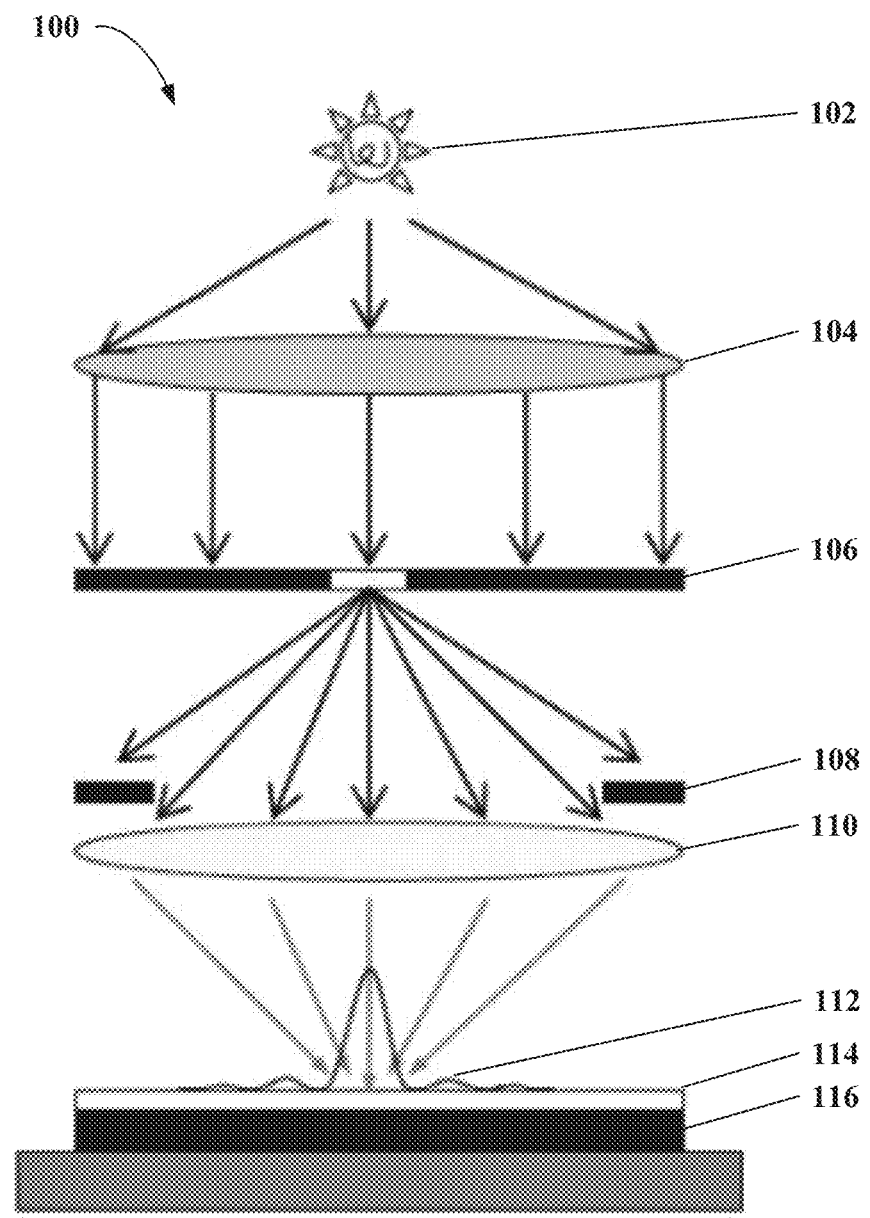
FIG. 1 is an example of a lithography system.

The process of manufacturing integrated circuits (ICs) involves several phases. In a simplified view, the process includes a design phase, a manufacturing phase, and an inspection phase. The design phase can include simulations of the manufacturing phase and the inspection phase.

A mask (akin to a photographic negative and as further described below) is designed. The mask is used during the lithography process (i.e., the manufacturing process) to etch design patterns (e.g., design shapes) onto a wafer. The design patterns and shapes are also referred to herein as polygons or design polygons. A polygon, as used herein, also encompasses curvilinear shapes, or portions thereof, that are approximated using line segments. For example, a circle can be approximated using a set of short segments connected head to tail. Mask errors can render the printed (i.e., manufactured) ICs defective and inoperative. Therefore, it is critical that masks be optimized so that ICs printed using the masks are as close to the design patterns as possible.

The mask is optimized via, typically, an iterative process that includes using Inverse lithography technology (ILT) and a model-based optical proximity correction (OPC).

Inverse lithography technology (ILT) is a process window based optimization that can be useful for improving resist image fidelity on a wafer. ILT can be used to determine, for example, an optimized mask image that produces designed wafer target patterns within allowed tolerances. ILT can be based on known functional transformation modeling of the photolithography process. For example, the functional transformation can be used for modeling electromagnetic, optical, chemical, or lithographic transfer effects. Because the forward transfer is many-to-one (i.e., many different mask images can produce the same wafer patterns), ILT can be considered an optimization technique. ILT can generate a pixelated mask image (i.e., a bitmap). As such, ILT tools operate in the image (i.e., pixel) domain.

Inverse lithography (ILT) techniques can be used to, for example, extract mask patterns (i.e., mask shapes) from a printed wafer. As further described below, ILT can be understood to generate a mask image from the design pattern. The ILT process simulates the reverse of the lithography process. For example, the ILT process can receive, as input, the desired design pattern, inverse-simulate the lithography process, and output a mask image (i.e., a bitmap of pixels).

Optical proximity correction (OPC) process can be used in conjunction with the ILT process to make local adjustments on new mask patterns generated by the ILT optimization. An edge based OPC process can convert a grayscale optimized image received from the ILT process to a mask pattern of polygons. As such, OPC tools operate in the polygon domain.

Obtaining an optimized mask is typically an iterative process that, given a design pattern, generates a mask that can be used, during the manufacturing process, to produce the design pattern (or a very close approximation thereof) on a wafer. The optimized mask is typically a digital representation of the polygons of the mask. The digital representation is typically provided to a mask manufacturer who produces a physical mask to be used in printing (i.e., manufacturing) the ICs of the design patterns.

When a mask is produced, a discrepancy may exist between the optimized mask and the manufactured mask. The discrepancy may be due (at least partially) to the mask manufacturing process itself. The discrepancy is referred to herein as a "mask error." An example of a mask error is a bias error. The bias error is related to the ebeam machine used to generate the optimized mask. For example, the ebeam machine may produce linewidths that are larger than the design linewidths. For example, the ebeam machine may produce polygons that are slightly larger or slightly smaller than the design polygons. As such, it is desirable to include (e.g., incorporate, account for, etc.) the mask error (e.g., mask bias) during mask optimization.

As explained with respect to FIG. 3 below, in an example of incorporating mask bias into the mask optimization process, the mask bias is added to polygons. As such, a mask image (i.e., a bitmap) is inverse dithered into polygons in order to add the mask bias. "Biasing a polygon" and "adding a bias to the polygon" are used interchangeably herein. Inverse dithering refers to the process of extracting polygons (i.e., mask shapes) from a mask image. The mask image is a grayscale bitmap, as further explained below. Inverse dithering is a computationally expensive operation, especially given that it may need to be performed with every optimization iteration.

Accordingly, a need exists for integrating mask bias into the mask optimization process without inverse dithering. That is, it is desirable to add the mask bias to a mask image rather than to the mask polygons. Adding the mask bias can include adding an approximation of the mask bias to a mask image. As mentioned above, "adding a mask bias to a mask polygon" and "biasing the mask polygon" are used interchangeably.

Implementations according to this disclosure add an approximation of the mask error, such as mask bias, to a mask image (i.e., a grayscale bitmap), thereby eliminating the need for the computationally expensive inverse dithering process. The mask error can be approximated by interpolating a mask image to obtain the biased mask image. The interpolation can be a Taylor expansion. A first order Taylor expansion can be used. By including a mask bias in the optimization process of the mask image, the shapes of the optimized mask can more closely match the shapes printed on a wafer during the manufacturing process.

Details are described herein after first describing an environment in which the mask bias approximation disclosed herein may be implemented.

FIG. 1 is an example of a lithography system 100. A light source 102 emits light that passes through a lens system 104 (e.g., a condenser lens system). The lens system 104 can transform the light as collinear. The collinear light illuminates a mask 106. The mask 106 can include patterns or shapes (referred to as "mask patterns") representing desired shapes to be transferred onto a substrate (e.g., a silicon wafer). The desired shapes can be shapes created during the design phase.

The material (e.g., quartz) of the mask 106 can be made to have different transmittances in different regions to represent the mask patterns. The light passing through the mask 106 carries the information of the mask patterns, which can form an image near the surface of a downstream side of the mask 106, which can be referred to as a "mask image." After passing through an aperture 108 and an objective lens system 110, the mask image can be focused to form an aerial image 112 (represented as intensity distributions in FIG. 2) above a photoresist 114 coated upon a substrate 116.

The incident light can expose regions of the photoresist 114 that modify their chemical properties. The modified photoresist 114 can be removed by applying a chemical solution (referred to as a "developer") to the exposed regions of the photoresist 114, which exposes regions of the substrate underneath. The exposed regions of the substrate 116 can be etched (e.g., by an acid), while the unexposed regions of the substrate 116 can be protected by the unmodified regions of the photoresist 114. After the etching, the unmodified regions of the photoresist 114 can be removed by a chemical (referred to as a "resist stripper"), after which the mask patterns are transferred to the substrate (referred to as "substrate patterns").

The mask 106 can be used in optical lithography (referred to as an "optical mask"). A mask writing process can convert design patterns (e.g., including polygons) into the mask patterns. During the mask writing process, the design patterns can be transferred onto a photoresist layer of a mask blank (e.g., a quartz substrate covered with a layer of chromium) using a light beam (e.g., in a laser writer) or an ebeam (e.g., in an ebeam writer). The beam can be controlled to move across the surface of the photoresist layer in a predetermined scan manner (e.g., a raster scan manner). The photoresist on the mask can be modified. In a process similar to developing, etching, and resist stripping, the chromium layer can be etched to have the transferred design patterns that are able to transmit light.

The light emitted by the light source 102 may be diffracted, thereby causing deviations between the design patterns or shapes and the patterns or shapes of the integrated circuit. Deviations can also be caused by other process effects during the etching process. For example, it may not be possible, due to limitations of light, to maintain exact placement of edges.

Figure 2:
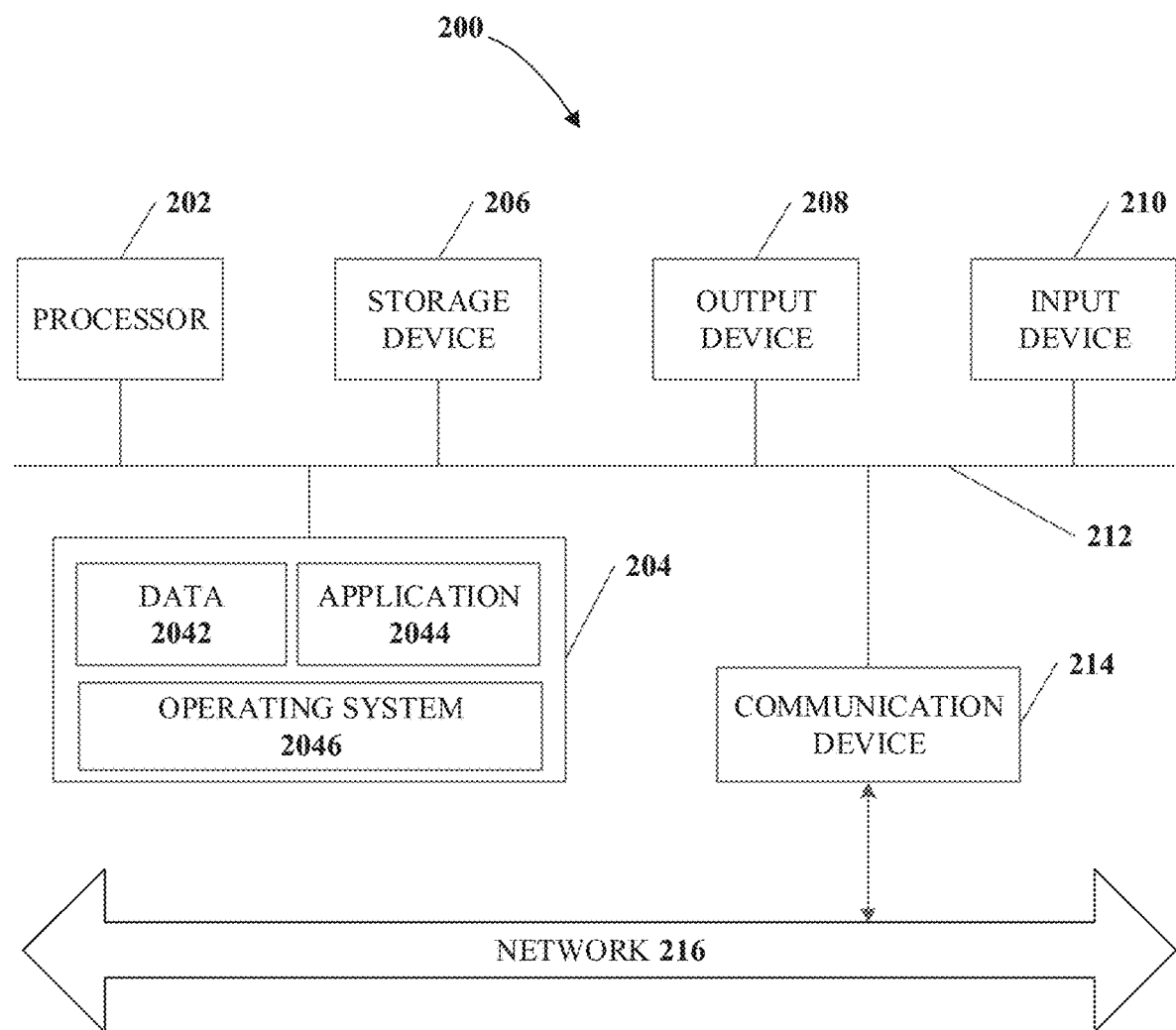
FIG. 2 is a diagram of an example of an apparatus that can be used for mask bias approximation according to implementations of this disclosure.

FIG. 2 is a diagram of an example of an apparatus 200 that can be used for mask bias approximation according to implementations of this disclosure. That is, the apparatus 200 can be used to obtain an optimized mask by a process that approximates the mask bias during the optimization. The apparatus 200 can include any number of any configurations of computing devices, such as a microcomputer, a mainframe computer, a supercomputer, a general-purpose computer, a special-purpose/dedicated computer, an integrated computer, a database computer, a remote server computer, a personal computer, or a computing service provided by a computing service provider, for example, a web host or a cloud service provider. In some implementations, the computing devices can be implemented in the form of multiple groups of computers that are at different geographic locations and can communicate with one another, such as by a network. While certain operations can be shared by multiple computers, in some implementations, different computers can be assigned to different operations. In some implementations, the apparatus 200 can be implemented using general-purpose computers/processors with a computer program that, when executed, carries out any of the respective methods, algorithms, and/or instructions described herein. In addition, for example, special-purpose computers/processors, which can contain specialized hardware for carrying out any of the methods, algorithms, or instructions described herein, can be utilized.

The apparatus 200 can have an internal configuration of hardware including a processor 202 and a memory 204. The processor 202 can be any type of device capable of manipulating or processing information. In some implementations, the processor 202 can include a central processing unit (CPU). In some implementations, the processor 202 can include a graphics processor (e.g., a graphics processing unit or GPU). For example, the GPU can provide additional graphical processing capability for at least one of pattern rendering, dose map optimization, mask-making simulation, substrate-manufacturing simulation, and mask bias approximation. Although the examples herein are described with a single processor as shown, advantages in speed and efficiency can be achieved using multiple processors. For example, the processor 202 can be distributed across multiple machines or devices (in some cases, each machine or device can have multiple processors) that can be coupled directly or connected to a network. The memory 204 can be any transitory or non-transitory device capable of storing codes and data that can be accessed by the processor (e.g., via a bus). For example, the memory 204 can be accessed by the processor 202 via a bus 212. Although a single bus is shown in the apparatus 200, multiple buses can be utilized. The memory 204 herein can be a random-access memory (RAM) device, a read-only memory (ROM) device, an optical/magnetic disc, a hard drive, a solid-state drive, a flash drive, a security digital (SD) card, a memory stick, a compact flash (CF) card, or any combination of any suitable types of storage devices. In some implementations, the memory 204 (e.g., a network-based or cloud-based memory) can be distributed across multiple machines or devices. The memory 204 can store data 2042, an operating system 2046, and/or an application 2044. The data 2042 can be any processable data (e.g., computerized data files or database records). The application 2044 can include programs that permit the processor 202 to implement instructions to perform functions described in this disclosure. For example, when the application 2044 is run, a set of algorithms, processes, or operations can be executed for dose map creation, dose map optimization, mask-making process simulation, substrate-manufacturing simulation, and/or mask bias approximation.

In some implementations, in addition to the processor 202 and the memory 204, the apparatus 200 can include a secondary storage device 206, which can be an additional storage device, an external storage device, or the like. The secondary storage device 206 can provide additional storage capacity for high processing needs. The secondary storage device 206 can be a storage device in the form of any suitable transitory or non-transitory computer-readable media, such as a memory card, a hard disk drive, a solid-state drive, a flash drive, or an optical drive. Further, the secondary storage device 206 can be a component of the apparatus 200 or can be a shared device that can be accessed via a network. In some implementations, the application 2044 can be stored in whole or in part in the secondary storage device 206 and loaded into the memory 204. For example, the secondary storage device 206 can be a storage device used for long-term storage, such as a database.

In some implementations, in addition to the processor 202 and the memory 204, the apparatus 200 can include an output device 208. The output device 208 can be, for example, a display coupled to the apparatus 200 for displaying graphics data. If the output device 208 is a display, for example, it can be a liquid crystal display (LCD), a cathode-ray tube (CRT) display, or any other output device capable of providing a visible output to an individual. The output device 208 can also be any device capable of transmitting visual, acoustic, or tactile signals to a user, such as a touch-sensitive device (e.g., a touchscreen), a speaker, an earphone, a light-emitting diode (LED) indicator, or a vibration motor. In some implementations, the output device 208 can also function as an input device (e.g., a touchscreen display configured to receive touch-based input). For example, the output device 208 can include a display that can display images, simulation results, simulation parameters, or a combination thereof.

In some implementations, the output device 208 can also function as a communication device for transmitting signals and/or data. For example, the output device 208 can include a wired means for transmitting signals or data from the apparatus 200 to another device. For another example, the output device 208 can include a wireless transmitter using a protocol compatible with a wireless receiver to transmit signals from the apparatus 200 to another device.

In some implementations, in addition to the processor 202 and the memory 204, the apparatus 200 can include an input device 210. The input device 210 can be, for example, a keyboard, a numerical keypad, a mouse, a trackball, a microphone, a touch-sensitive device (e.g., a touchscreen), a sensor, or a gesture-sensitive input device. Any type of input device not requiring user intervention is also possible. For example, the input device 210 can be a communication device, such as a wireless receiver operating according to any wireless protocol for receiving signals. The input device 210 can output signals or data, indicative of the inputs, to the apparatus 200, for example, via the bus 212. For example, a user or operator can provide simulation-related information to the apparatus 200 via the input device 210. For another example, the input device 210 can also be an interface (e.g., a scanner) that can enable a user to provide images to the apparatus 200 related to the design pattern of the mask.

In some implementations, in addition to the processor 202 and the memory 204, the apparatus 200 can optionally include a communication device 214 to communicate with another device. Optionally, the communication can occur via a network 216. The network 216 can include one or more communications networks of any suitable type in any combination, including, but not limited to, Bluetooth networks, infrared connections, near-field connections (NFCs), wireless networks, wired networks, local area networks (LANs), wide area networks (WANs), virtual private networks (VPNs), cellular data networks, or the Internet. The communication device 214 can be implemented in various ways, such as a transponder/transceiver device, a modem, a router, a gateway, a circuit, a chip, a wired network adapter, a wireless network adapter, a Bluetooth adapter, an infrared adapter, an NFC adapter, a cellular network chip, or any suitable type of device in any combination that can communicate with the network 216. For example, the communication device 214 can connect to a mask maker via the network 216 to send the generated or optimized dose map to a multi-beam mask writer. For another example, the communication device 214 can also be connected to another computing device that includes an Electronic Design Automation (EDA) tool to generate a target substrate design based on one or more layers of the desired IC design. For another example, remote control instructions can be received by the communication device 214 from another computing device connected to the network 216 for remote control of the apparatus 200.

The apparatus 200 (and any algorithms, methods, instructions, etc., stored thereon and/or executed thereby) can be implemented as hardware modules, such as, for example, intellectual property (IP) cores, application-specific integrated circuits (ASICs), programmable logic arrays, optical processors, programmable logic controllers, microcode, firmware, microcontrollers, servers, microprocessors, digital signal processors, or any other suitable circuit. Further, portions of the apparatus 200 do not necessarily have to be implemented in the same manner.

Figure 3:
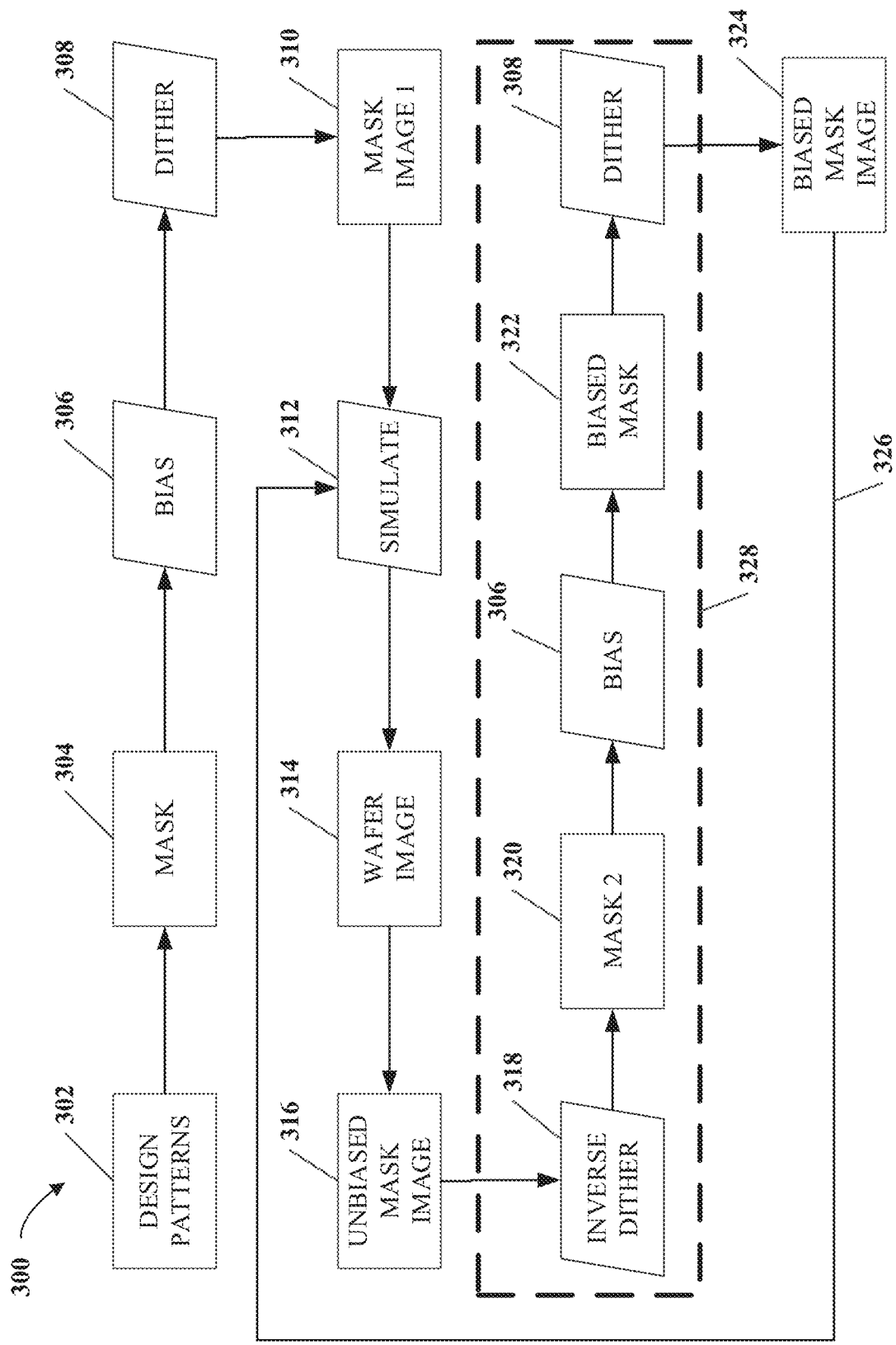
FIG. 3 is an example of a process for mask optimization.

FIG. 3 is an example of a process 300 for mask optimization. The process 300 does not approximate the bias mask error, as described with respect to FIG. 6 below; rather, the process 300 biases the shapes of a mask.

Design patterns 302 can include symbolic or vectorized data (e.g., in GDS (Graphic Data System), or GDSII data format). The design patterns 302 can include any geometric shape having any geometric features (e.g., points, lines, or curves). As such, the design patterns 302 can be polygons. Starting with the design patterns 302, the process 300 generates an unbiased mask image 316. The unbiased mask image 316 is an optimized mask image. The process 300 is an iterative process, as further explained below. With each iteration a more optimized mask image (i.e., the unbiased mask image 316) is obtained. As such, the unbiased mask image 316 is an intermediate optimized (e.g., calculated) mask image.

The process 300 can generate an initial mask (i.e., a mask patterns 304) from the design patterns 302. The mask patterns 304 includes a set of polygons, which may be printable and non-printable polygons. The printable polygons are the shapes that are to be transferred onto a wafer. The non-printable polygons can be sub-resolution assistant features (SRAFs). In an example, OPC can be used to obtain the mask patterns 304 from the design patterns 302.

A biasing operation 306 can add a mask error bias to the polygons of the mask patterns 304. As mentioned above, the biasing operation simulates (e.g., accounts for) the error produced by an ebeam machine. That is, the biasing operation pre-compensates for the mask error that may be introduced during the manufacture of the mask. The biasing operation 306 can generate (e.g., produce, obtain, calculate, etc.) a biased mask image (not shown).

Figure 4:
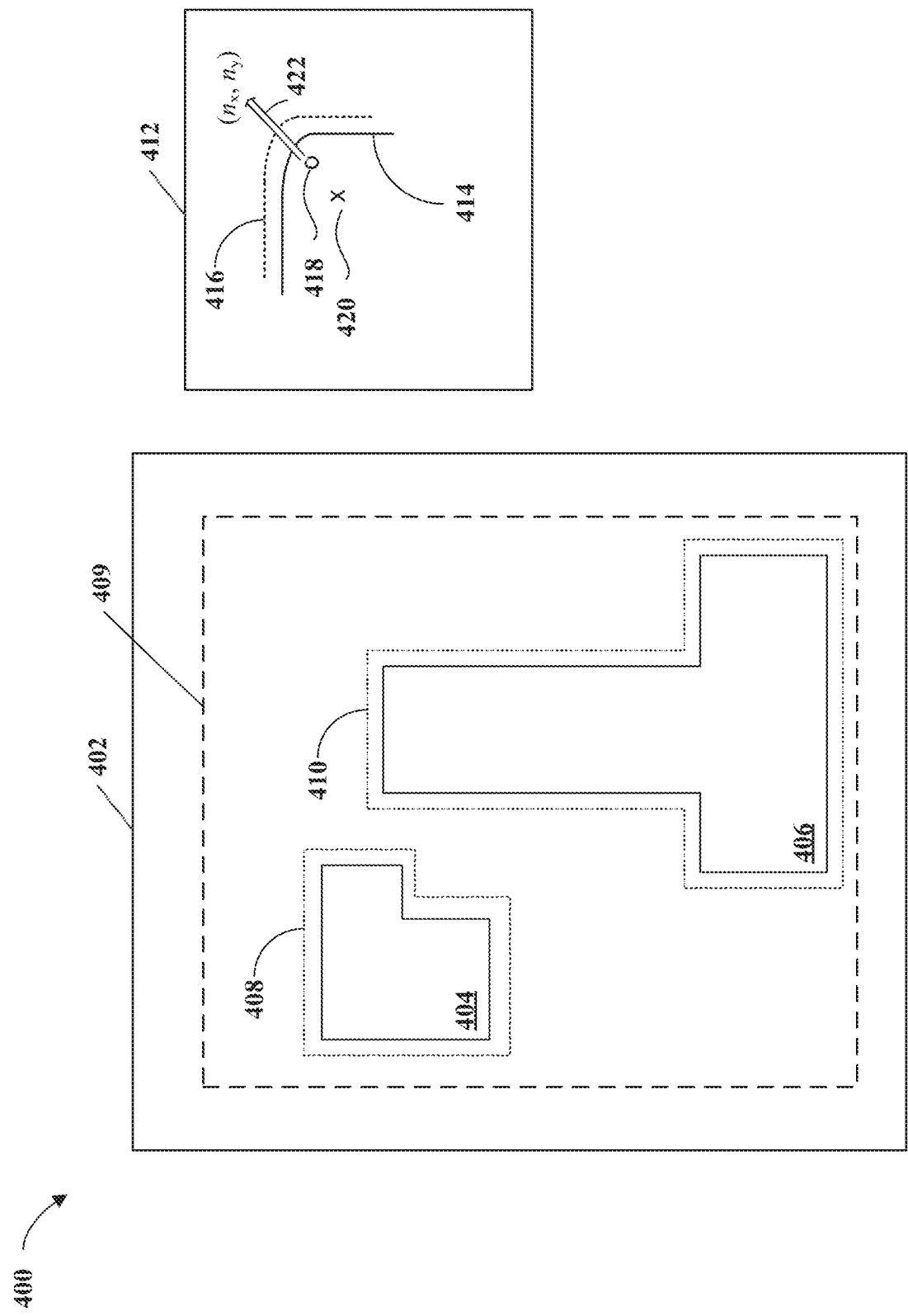
FIG. 4 illustrates an example of mask bias according to implementations of this disclosure.

FIG. 4 illustrates an example 400 of mask bias according to implementations of this disclosure. The example 400 includes a mask 402, which includes a mask shape 404 and a mask shape 406.

Biasing a mask shape means modifying the mask shape based on a bias value. The bias value can be related to the ebeam machine to be used. Typical bias values are in the range of a few nanometers (e.g., ±1 nm). Modifying a mask shape means to shrink or expand the mask shape by the bias value. For example, if the bias value is a positive value, then the mask shape is expanded by the bias value. For example, if the bias value is a negative value, then the mask shape is shrunk by the bias value. The example 400 illustrates that the mask shapes 404-406 are expanded by a bias value. As such, biased mask shapes 408-410 are obtained when the mask shapes 404-406 are biased by a positive bias value.

Biasing a mask shape can mean that every point along the contour of the mask shape is moved outwardly (i.e., in the case of expanding) or inwardly (i.e., in the case of shrinking) along the normal direction of the contour of the shape at that point. The original mask shapes (e.g., the mask shapes 404-406) and the biased mask shapes (e.g., the biased mask shapes 408, 410) are similar (e.g., they have congruent angles and proportional sides).

FIG. 4 also includes a mask image 412. The mask image 412 illustrates a small section of a mask image. The mask image 412 is further described below with respect to FIG. 6. It is noted that the mask image 412 is a bitmap. As such, the mask image 412 is not described (e.g., defined) in terms of shapes. The mask image 412 includes pixels, wherein each pixel has a corresponding pixel value (e.g., an intensity value). That is, while the mask image 412 includes embedded shapes (i.e., the shapes can be extracted via, for example, inverse dithering of the mask image 412), the mask image 412 is itself a collection of pixels. As such, while a portion of a shape (referred to, for simplicity, as a shape 414) is shown, the shape 414 is an embedded (e.g., an implicit) shape that is embedded in, and extractable from, the pixels of the mask image 412.

Returning to FIG. 3, a dithering operation 308 can be used to generate an initial mask image 310 from the biased mask image that is generated by the biasing operation 306. For example, the polygons in the mask pattern can be rendered (i.e., "dithered") to form the initial mask image 310, and the initial mask image 310 can be transferred (or "transformed") to the substrate pattern via a simulation operation 312. The simulation operation can be a series of image filtering processes, starting from the mask image to provide an aerial image from which a resist image can be derived. The mask patterns are, on the other hand, binary polygons. As such, it is necessary to first dither the mask pattern into an image that serves as an input for the simulation process.

The wafer image 314 can be compared to a bitmap image (not shown) of the design patterns 302. Differences between the wafer image 314 and the bitmap image of the design patterns are reduced by generating an unbiased mask image 316, which is a modification of the initial mask image 310. However, if the differences are within a threshold, then the process 300 can terminate (not shown). In such a case, mask patterns can be extracted from the mask image that is available after the simulation operation 312 and before the unbiased mask image 316 is generated.

As mentioned above, mask bias is performed at (i.e., applied to) polygons (i.e., mask shapes). However, the unbiased mask image 316 is a bitmap (e.g., a grayscale image). As such, in order to re-add the mask bias before performing an iteration of optimizing the mask image, an inverse dithering operation 318 can be applied to the unbiased mask image 316. The inverse dithering operation 318 obtains mask polygons (i.e., an iteration mask patterns 320) from the bitmap mask image (i.e., the unbiased mask image 316). The iteration mask patterns 320 is similar to the mask patterns 304. As such, the dithering operation 308 is applied to the iteration mask patterns 320 to obtain a biased mask 322. The dithering operation 308 is applied to the biased mask 322 to obtain a biased mask image 324. The biased mask image 324 is similar to the initial mask image 310. As such, the process 300 can perform on the biased mask image 324 operations similar to those applied to the initial mask image 310, as illustrated by a loop-back arrow 326.

As mentioned above, the operations encompassed within the dashed area 328 (i.e., inverse dithering in order to add the mask bias) can be computationally expensive. As such, implementations according to this disclosure can add the mask bias to a mask image. That is, implementations according to this disclosure can add the mask bias without performing the inverse dithering operation 318, the biasing operation 306, and the dithering operation 308 during the mask image optimization iterations.

As mentioned above, the process 300 is an iterative process. The difference between the pre- and post-iteration mask images is the mask image error. In an example, the mask image error can be the sum of square difference between the pre- and post-iteration mask images. However, other measures of image differences can be used. For example, at the end of a first iteration, the initial mask image 310 is the pre-iteration mask image, and the biased mask image 324 is the post-iteration mask image. As such, the difference between the initial mask image 310 and the biased mask image 324 is the mask image error.

Figure 5:
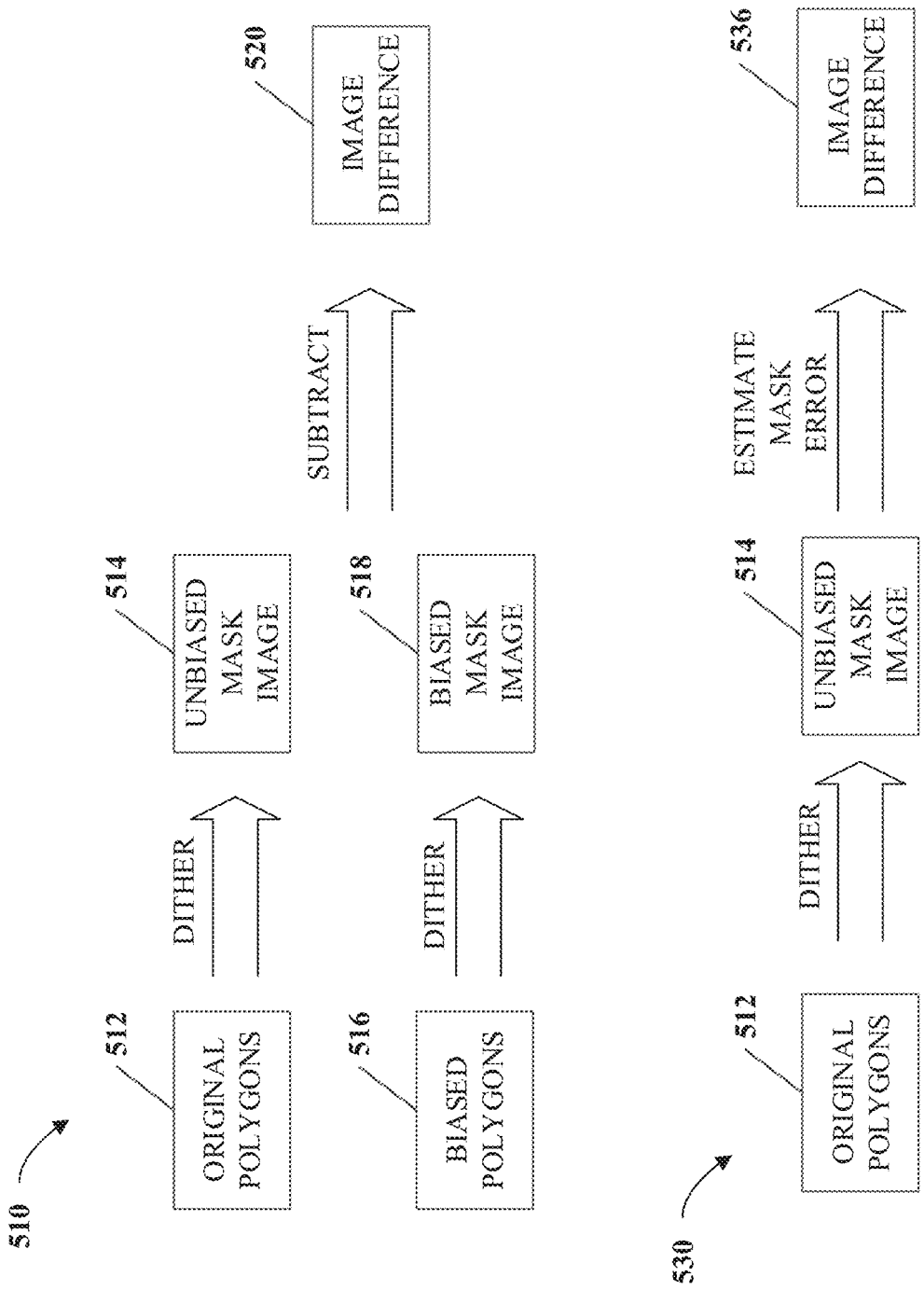
FIG. 5 illustrates a comparative example of mask error according to implementations of this disclosure.

FIG. 5 illustrates a comparative example of mask error according to implementations of this disclosure. Two mask error techniques are illustrated in FIG. 5. A strict computation technique 510 can correspond to the process 300 of FIG. 3. An approximation technique 530 corresponds to implementations according to this disclosure.

In the strict computation technique 510, an original polygons 512 of unbiased polygons is dithered to obtain an unbiased mask image 514, and biased polygons 516 is dithered to obtain a biased mask image 518. For example, the original polygons 512 can be the mask patterns 304 of FIG. 3. For example, the original polygons 512 can be the iteration mask patterns 320 of FIG. 3. For example, the biased polygons 516 can be the biased mask 322 of FIG. 3, or the biased mask image 518 can be the biased mask image 324 of FIG. 3. Subtracting (e.g., pixel-by-pixel) the unbiased mask image 514 from the biased mask image 518 provides an image difference 520 that is the difference (e.g., a residual) between the unbiased mask image 514 and the biased mask image 518.

In the approximation technique 530, the mask error can be estimated directly from the unbiased mask image 514. As described below, a Taylor Expansion can be used to estimate the mask bias error. That is, the approximation technique 530 approximates the image difference 520 with an image difference 536.

Figure 6:
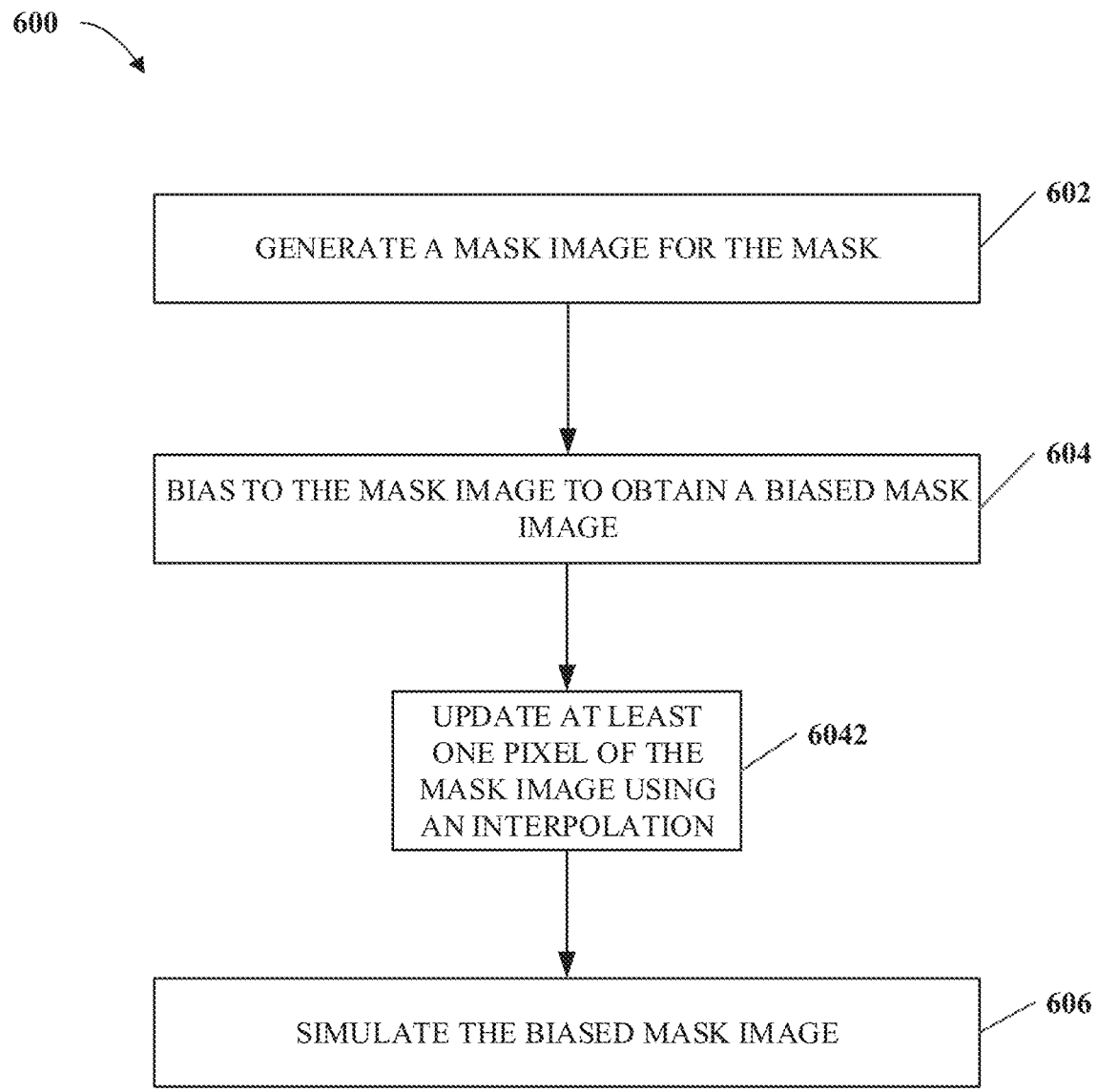
FIG. 6 is an example of a process for optimizing a mask used to produce a design pattern by an ebeam according to an implementation of this disclosure.

FIG. 6 is an example of a process 600 for optimizing a mask used to produce a design pattern by an ebeam according to an implementation of this disclosure. The process 600 can be implemented in hardware or software. For example, the process 600 can be implemented in software stored as instructions and/or data in the memory 204 and executable by the processor 202 of the apparatus 200. For another example, the process 600 can be implemented in hardware as a specialized chip storing instructions executable by the specialized chip.

As mentioned above, optimizing a mask is an iterative process that simulates, during each iteration (or at least some of the iterations) an iteration mask image to predict (e.g., determine) the wafer patterns that are produced by the iteration mask image. The simulation process mimics the ebeam writing process. The process 600 adds a mask bias directly to the iteration mask image before performing the simulation. That is, the process 600 adds the mask bias without inverse dithering the iteration mask image into polygons (e.g., geometric shapes).

At 602, the process 600 generates a mask image for the mask. The mask image can be any mask image to which mask bias is to be added. In an example, the mask image can be the unbiased mask image 316 of FIG. 3. In an example, the mask image can be the original polygons 512 of FIG. 5.

At 604, the process 600 biases the mask image to obtain a biased mask image. At 606, the process 600 simulates the biased mask image, such as described with respect to the simulation operation 312 of FIG. 3.

In an example, the process 600 biases (at 604) the mask image by updating, at 6042, at least one pixel of the mask image using an interpolation of neighboring pixels of the at least one pixel. The interpolation can depend on a predetermined value (i.e., an interpolation parameter). The predetermined value can be, or be indicative of, a bias value of a particular ebeam machine that will be used in conjunction with the mask to print ICs. As such, the predetermined value can be provided (such as by an operator of the apparatus 200) to the process 600. In another example, the predetermined value can be a default value, such as 1 nm, 2 nm, or other default value.

In an example, the interpolation can be based on a Taylor expansion. The Taylor expansion can be a Taylor expansion to the first order. The Taylor expansion can be used to approximate the image difference. That is, the Taylor expansion can be used, for example, to directly add the image difference 536 to a mask image, such as the mask image 514 of FIG. 5 or the mask image 316 of FIG. 3. That is, the image difference, which is an approximation of the mask bias error, can be added to a mask image (i.e., a bitmap) without first having to inverse dither the mask image.

As mentioned above, the mask image is a bitmap image consisting of pixel locations. In the mask image, each pixel has a Cartesian location (x, y). The pixel locations of the mask image are at discrete locations. That is, for an image of size M×N, where M and N are integer values, x and y are such that x=0, 1, . . . , M−1 and y=0, 1, . . . , N−1.

The shape 414 of FIG. 4 is now used to describe obtaining the biased mask image using a Taylor expansion. The process 600 can be thought of as biasing the pixels of the shape 414 to obtain the pixels of a shape 416. Again, the shape 416 is a shape that is embedded in the pixels of the biased pixels of the mask image 412.

To reiterate, the process 600 does not generate the mask shapes 414 or 416. However, given a mask image, the process 600 calculates pixel values for a biased mask image using the pixel values of the mask image. In an example, the process 600 can create a new biased mask image from a mask image. In another example, the process 600 can modify, using the Taylor expansion, at least some of the pixel values of the mask image such that when the modification process is completed, the mask image becomes the biased mask image.

A biased pixel 418 is assumed to be a pixel of a biased polygon. That is, the pixel 418 is a pixel of the biased mask image. An original pixel 420 is the original location of the biased pixel 418. That is, the biased pixel 418 is assumed to be at the original pixel 420. That is, the value of the biased pixel 418 is copied from the value of the original pixel 420. That is, in a case of biasing the mask image itself (e.g., the mask image 412), the value at the location of the biased pixel 418 is overwritten by the value of the original pixel 420. The biased pixel 418 represents an arbitrary pixel on the mask image 412, including pixels on the contours of biased shapes. As such, the biased pixel 418 can be a pixel on the contour of the shape 416.

The biased pixel 418 is a pixel of the biased mask image. That is, the biased pixel 418 is at an integer pixel location. However, the original pixel 420 may not be at an integer pixel location of the unbiased mask image. As such, the biased pixel 418 (more specifically, the value of the biased pixel 418) is interpolated from the values of pixels at integer locations of the unbiased mask image. The location of the original pixel 420 is referred to as the inverse shifted location of the biased pixel 418. As such, a biased pixel of the biased mask image (e.g., the biased pixel 418) takes the value of the pixel that is at the inversely shifted location (e.g., the original pixel 420) of the biased pixel.

The inversely shifted location (e.g., the original pixel 420) can be thought of as answering the question: Where should a value of a pixel in the biased mask image be copied from in the unbiased mask image? Collectively, the pixels of the shape 414 are biased into the pixels of the shape 416.

To reiterate, the process 600 can, for each pixel of some pixels of the unbiased mask image, update the pixel (i.e., update the pixel value) from the values of neighboring pixels, which may not be at integer pixel locations. In an example, the process 600 can update each pixel of the unbiased mask. For example, if the unbiased mask image is an M×N image, then the process 600 can update each of the pixels starting from (0, 0) to (M−1, N−1) in a raster scan order using neighboring pixels of the pixel. For example, if the mask image is of size 100×100 pixels, then the process 600 performs 100*100=10,000 calculations.

In another example, less than all pixels of the unbiased mask image are updated. For example, the process 600 can update every (aL, bL) pixel of an M×N image mask, where a=0, 1, ..., M/L and b=0, 1, ..., N/L. For example, if L=20, then the process 600 can update pixels (0, 0), (20, 20), (20, 40), (20, 60), (20, 80), (20, 100), (40, 20), (40, 40), etc.

In an example, if a pixel value that is required for a calculation (as described below) is not available (i.e., an unavailable value), then a default value can be assumed. In another example, the calculation is adjusted to exclude the unavailable value.

In a typical situation, the shapes of a mask are concentrated at the center of the mask. For example, as shown in FIG. 4, the shapes 408-410 are concentrated inside an area 409 of the mask 402. As such, the process 600 can exclude calculating pixels around the boundaries of the biased mask image.

Again, the result of a calculation for a pixel at location (x, y) of the biased mask image determines the location of a pixel in the unbiased mask image from which the value is to be copied to the pixel at location (x, y). As such, the result of the calculation is a location (x', y') (e.g., the location of the original pixel 420). Depending on the interpolation method used, the location (x', y') may not be an integer location of the mask image. That is, the location (x', y') may be a sub-pixel location (i.e., a location that is in between integer pixel locations). As such, the value of the pixel at location (x', y') is determined as an interpolation of neighboring pixel locations. As mentioned above, a first order Taylor expansion can be used to perform the interpolation.

As indicated above, a pixel of a shape is biased along the normal direction of the contour of the shape at that pixel. A normal vector 422, ($n_x$, $n_y$), represents the normal vector along which the original pixel 420 is biased (in this case, expanded) to the biased pixel 418. Accordingly, a pixel value at location (x, y) of the biased mask image, $MI^{biased}$ can be calculated as given by equation (1):

$$MI^{biased}(x,y) = MI(x',y') \approx MI(x - n_x b, y - n_y b) \quad (1)$$

That is, the pixel value at location (x, y) of the biased image, $MI^{biased}$ can be derived from the un-projected (i.e., inversely shifted) location of the same pixel in the unbiased mask image, MI. The un-projection is the un-projection of the bias value b in each of the directions of the normal vector ($n_x$, $n_y$). That is, for example, determining the value of a pixel at location (x, y) in the biased mask image corresponds to looking up the value of the pixel that is b pixels away (i.e., backward in the case of expanding, and forward in the case of shrinking) along the normal vector ($n_x$, $n_y$).

Each of the components of the normal vector, namely, $n_x$ and $n_y$, can be calculated as given by equation (2):

$$n_x = \frac{-\frac{\partial MI}{\partial x}}{\sqrt{\left(\frac{\partial MI}{\partial x}\right)^2 + \left(\frac{\partial MI}{\partial y}\right)^2}}; \quad (2)$$

$$n_y = \frac{-\frac{\partial MI}{\partial y}}{\sqrt{\left(\frac{\partial MI}{\partial x}\right)^2 + \left(\frac{\partial MI}{\partial y}\right)^2}}$$

That is, the x component (i.e., $n_x$) of the normal vector 422 can be calculated as the change in the x direction of the mask image MI divided by the magnitude of the normal vector 422; and the y component (i.e., $n_y$) of the normal vector 422 can be calculated as the change in the y direction of the mask image MI divided by the magnitude of the normal vector 422. The normal vector points to the direction perpendicular to the image contour. As such, and by definition, the normal vector is in the same, or the opposite, direction as the gradient $$\left(\frac{\partial MI}{\partial x}, \frac{\partial MI}{\partial y}\right).$$

In a case (i.e., in the case of enlarging shapes) where the opposite direction is chosen, a minus sign occurs in the numerator. Also, the normal vector is normalized so that the length of the normal vector is 1. The normalization coefficient is $$\frac{1}{\sqrt{\left(\frac{\partial MI}{\partial x}\right)^2 + \left(\frac{\partial MI}{\partial y}\right)^2}}.$$

However, the components of the normal vector, ($n_x$, $n_y$), need not be explicitly calculated, as further detailed below. An expression for deriving the pixel values of the biased mask image, $MI^{biased}$ can be derived from the expressions of the components of the normal vector of equation (2).

Equation (1) can be rewritten as follows:

$$MI^{biased}(x, y) \approx MI(x - n_x b, y - n_y b) \approx \quad (3)$$
$$MI(x, y) - n_x b \frac{\partial MI}{\partial x} - n_y b \frac{\partial MI}{\partial y}$$

The left hand side approximation of equation (3) can be understood to mean that when a polygon expands with a vector ($n_xb,n_yb$), the new image pixel intensity at (x, y), in the expanded image, is the same as the intensity at ($x-n_xb$, $y-n_yb$) of the original image pixel intensity. The Taylor expansion to the first order around the point (x, y) is used to provide the approximation, as shown with respect to the right hand side approximation of equation (3).

Combining equations (2) and (3) results in equation (4):

$$MI^{biased}(x, y) \approx MI(x, y) + \qquad (4)$$

$$\left(\frac{\frac{\partial MI}{\partial x}}{\sqrt{\left(\frac{\partial MI}{\partial x}\right)^2 + \left(\frac{\partial MI}{\partial y}\right)^2}}\frac{\partial MI}{\partial x} + \frac{\frac{\partial MI}{\partial y}}{\sqrt{\left(\frac{\partial MI}{\partial x}\right)^2 + \left(\frac{\partial MI}{\partial y}\right)^2}}\frac{\partial MI}{\partial y}\right)b$$

$$MI^{biased}(x, y) \approx MI(x, y) + \left(\frac{\left(\frac{\partial MI}{\partial x}\right)^2 + \left(\frac{\partial MI}{\partial y}\right)^2}{\sqrt{\left(\frac{\partial MI}{\partial x}\right)^2 + \left(\frac{\partial MI}{\partial y}\right)^2}}\right)b$$

$$MI^{biased}(x, y) \approx MI(x, y) + \left(\sqrt{\left(\frac{\partial MI}{\partial x}\right)^2 + \left(\frac{\partial MI}{\partial y}\right)^2}\right)b$$

Equation (4) can be recognized as the first order Taylor expansion, where b (i.e., the bias value) is the expansion variable.

Equation (4) assumes that the mask image MI has a continuous coordinate system. However, that is not technically accurate since the mask image MI includes only pixel values at discrete (i.e., integer) locations in the x and y directions. Additionally, calculating the partial derivatives $$\left(i.e., \frac{\partial MI}{\partial x} \text{ and } \frac{\partial MI}{\partial y}\right)$$

of equation (4) for each calculated location of the biased mask image $MI^{biased}$ can be slow and may not be accurate. To remedy these deficiencies, the partial derivatives can be calculated using a sinc filter, as shown in equation (5) below.

To reiterate, to calculate the partial derivatives, a continuous function is required. As the mask image MI is not a continuous function, the sinc filter can be used to provide a continuous mask image.

It is noted that by convolving the mask image MI with the sinc filter in the x and y directions (e.g., convolving the mask image IM with a sinc filter in the x direction followed by a convolution of the result with a sinc filter in the y direction), a mask image value can be derived at any continuous (i.e., integer or sub-pixel) location of the mask image MI. More specifically, a Hamming-sinc filter can be used to reconstruct (i.e., determine a value of) any pixel (e.g., integer pixel or sub-pixel) value of the mask image. This follows from the Nyquist theorem, which states that a continuous signal can be reconstructed from discrete samples (taken at a certain sampling rate) of the continuous signal. The pixel values of the mask image (i.e., the unbiased mask image) constitute the samples. The sinc filter can extend 10 pixels at both sides of a pixel.

$$\left(i.e., \frac{\partial MI}{\partial x} \text{ and } \frac{\partial MI}{\partial y}\right)$$

Referring back to equation (4), it can be seen that the partial derivatives of the mask image are used. As such, the mask image MI can be convolved with the derivative of the sinc function, as shown in equation (5):

$$\begin{cases} \frac{\partial MI}{\partial x(x, y)} = \sum_i \sum_j MI(j, i) * \text{sinc}'_x(x - j) * \text{sinc}(y - i) \\ \frac{\partial MI}{\partial y(x, y)} = \sum_i \sum_j MI(j, i) * \text{sinc}'_x(x - i) * \text{sinc}(x - j) \end{cases} \qquad (5)$$

When deriving (i.e., calculating) the partial derivative at a pixel at location (x, y) in the x direction, the mask image MI can be convolved with the derivative of the sinc filter with respect to x (i.e., $\text{sinc}'_x(x-j)$), and the result can be convoluted with the sinc filter in the y direction (i.e., sinc(y−i)). Similarly, when deriving (i.e., calculating) the partial derivative at a pixel at location (x, y) in the y direction, the mask image MI can be convoluted with the derivative of the sinc filter with respect to y (i.e., $\text{sinc}'_y(y-i)$), and the result can be convoluted with the sinc filter in the x direction (i.e., sinc(x−j)).

The summation variables i and j of equation (5) define the size of the neighborhood of the location (x, y) to be used for the interpolation. The neighborhood is defined by the Hamming-sinc filter window size. In an example, the window size can be −10 pixels to +10 pixels. The Hamming-sinc filter extends 10 pixels at both sides of a pixel. As such, the total window size is the accumulated pixel sizes of 20 pixels.

Equation (5) can be rewritten as equation (6):

$$\begin{cases} \frac{\partial MI}{\partial x(x, y)} = \sum_j MI(j, y) * \text{sinc}'_x(x - j) \\ \frac{\partial MI}{\partial y(x, y)} = \sum_i MI(x, i) * \text{sinc}'_y(y - i) \end{cases} \qquad (6)$$

A Taylor expansion and a sinc filter are used to bias a mask image as described above. However, other techniques can be used to add the mask bias to (i.e., to bias) a mask image. For example, a finite differences technique can be used instead of the partial derivatives used in equations (4)-(5). That is, instead of the partial derivatives $$\frac{\partial MI}{\partial x} \text{ and } \frac{\partial MI}{\partial y},$$

the linear approximations $$\frac{\Delta MI}{\Delta x} \text{ and } \frac{\Delta MI}{\Delta y}$$

can be used, respectively. For example, $$\frac{\Delta MI}{\Delta x}$$

can be calculated as ($MI_x - MI_{x-1}$) (i.e., the difference between two consecutive pixel values in the x direction). Using the linear approximation, only two pixel values are considered, whereas, as described above with respect to the Hamming-sinc function (i.e., filter), 20 (or more or less) pixel values (i.e., samples) can be considered.

In another example, a central difference, such as $((MI_{x+1}-MI_{x-1})/2\Delta x)$, can be used. Other numerical differentiation techniques, including, but not limited to, the finite volume technique, the finite element technique, and the like, can also be used.

For simplicity of explanation, the process 600 is depicted and described as a series of steps or operations. However, the steps or operations in accordance with this disclosure can occur in various orders and/or concurrently. Additionally, other steps or operations not presented and described herein may be used. Furthermore, not all illustrated steps or operations may be required to implement a technique in accordance with the disclosed subject matter.

As described above, it should be noted that all or a portion of the aspects of the disclosure described herein can be implemented using a general-purpose computer/processor with a computer program that, when executed, carries out any of the respective techniques, algorithms, and/or instructions described herein. In addition, or alternatively, for example, a special-purpose computer/processor, which can contain specialized hardware for carrying out any of the techniques, algorithms, or instructions described herein, can be utilized.

The implementations of apparatuses as described herein (and the algorithms, methods, instructions, etc., stored thereon and/or executed thereby) can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing, either singly or in combination. The terms "signal" and "data" are used interchangeably. Further, portions of the apparatuses do not necessarily have to be implemented in the same manner.

The aspects of the disclosure described herein can be described in terms of functional block components and various processing operations. The disclosed processes and sequences can be performed individually or in any combination. Functional blocks can be realized by any number of hardware and/or software components that perform the specified functions. For example, the described aspects can employ various integrated circuit components (e.g., memory elements, processing elements, logic elements, look-up tables, and the like), which can carry out a variety of functions under the control of one or more microprocessors or other control devices. Similarly, where the elements of the described aspects are implemented using software programming or software elements, the disclosure can be implemented with any programming or scripting languages, such as C, C++, Java, assembler, or the like, with the various algorithms being implemented with any combination of data structures, objects, processes, routines, or other programming elements. Functional aspects can be implemented in algorithms that execute on one or more processors. Furthermore, the aspects of the disclosure could employ any number of techniques for electronics configuration, signal processing and/or control, data processing, and the like. The words "mechanism" and "element" are used broadly and are not limited to mechanical or physical implementations or aspects, but can include software routines in conjunction with processors, etc.

Implementations or portions of implementations of the disclosure can take the form of a computer program product accessible from, for example, a computer-usable or computer-readable medium. A computer-usable or computer-readable medium can be any device that can, for example, tangibly contain, store, communicate, or transport a program or data structure for use by or in connection with any processor. The medium can be, for example, an electronic, magnetic, optical, electromagnetic, or semiconductor device, such as a hard disk drive, a memory device, a solid-state drive, a flash drive, or an optical drive. Other suitable mediums are also available. Such computer-usable or computer-readable media can be referred to as non-transitory memory or media. Unless otherwise specified, a memory of an apparatus described herein does not have to be physically contained in the apparatus, but can be a memory that can be accessed remotely by the apparatus, and does not have to be contiguous with other memory that might be physically contained by the apparatus.

Any of the individual or combined functions described herein as being performed as examples of the disclosure can be implemented using machine-readable instructions in the form of code for the operation of any or any combination of the aforementioned computational hardware. The computational code can be implemented in the form of one or more modules by which individual or combined functions can be performed as a computational tool, the input and output data of each module being passed to/from one or more further modules during operation of the methods, apparatuses, and systems described herein.

Information, data, and signals can be represented using a variety of different technologies and techniques. For example, any data, instructions, commands, information, signals, bits, symbols, and chips referenced herein can be represented by voltages, currents, electromagnetic waves, magnetic fields or particles, optical fields or particles, other items, or a combination of the foregoing.

The particular aspects shown and described herein are illustrative examples of the disclosure and are not intended to otherwise limit the scope of the disclosure in any way. For the sake of brevity, electronics, control systems, software development, and other functional aspects of the systems (and components of the individual operating components of the systems) cannot be described in detail herein. Furthermore, the connecting lines or connectors shown in the various figures presented are intended to represent example functional relationships and/or physical or logical couplings between the various elements. Many alternative or additional functional relationships, physical connections, or logical connections can be present in a practical device.

The word "example" is used herein to mean serving as an example, instance, or illustration. Any aspect or design described herein as "example" is not necessarily to be construed as being preferred or advantageous over other aspects or designs. Rather, use of the word "example" is intended to present concepts in a concrete fashion. As used in this disclosure, the term "or" is intended to mean an inclusive "or" rather than an exclusive "or" for the two or more elements it conjoins. That is, unless specified otherwise or clearly indicated otherwise by the context, "X includes A or B" is intended to mean any of the natural inclusive permutations thereof. In other words, if X includes A; X includes B; or X includes both A and B, then "X includes A or B" is satisfied under any of the foregoing instances. The term "and/or" as used in this disclosure is intended to mean an "and" or an inclusive "or." That is, unless specified otherwise or clearly indicated otherwise by the context, "X includes A, B, and/or C" is intended to mean that X can include any combinations of A, B, and C. In other words, if X includes A; X includes B; X includes C; X includes both A and B; X includes both B and C; X includes both A and C; or X includes all of A, B, and C, then "X includes A, B, and/or C" is satisfied under any of the foregoing instances. Similarly, "X includes at least one of A, B, and C" is intended to be used as an equivalent of "X includes A, B, and/or C." In addition, the articles "a" and "an" as used in this application and the appended claims should generally be construed to mean "one or more" unless specified otherwise or clear from the context to be directed to a singular form. Moreover, use of the term "an aspect" or "one aspect" throughout this disclosure is not intended to mean the same aspect or implementation unless described as such.

The use of "including" or "having" and variations thereof herein is meant to encompass the items listed thereafter and equivalents thereof as well as additional items. Unless specified or limited otherwise, the terms "mounted," "connected," "supported," "coupled," and variations thereof are used broadly and encompass both direct and indirect mountings, connections, supports, and couplings. Further, "connected" and "coupled" are not restricted to physical or mechanical connections or couplings.

The use of the terms "a" and "an" and "the" and similar referents in the context of describing the disclosure (especially in the context of the following claims) should be construed to cover both the singular and the plural. Furthermore, the recitation of ranges of values herein is merely intended to serve as a shorthand method of referring individually to each separate value falling within the range, unless otherwise indicated herein, and each separate value is incorporated into the specification as if it were individually recited herein. Finally, the operations of all methods described herein are performable in any suitable order unless otherwise indicated herein or otherwise clearly contradicted by the context. The use of any and all examples, or language suggesting that an example is being made (e.g., "such as"), provided herein is intended merely to better illuminate the disclosure and does not pose a limitation on the scope of the disclosure unless otherwise claimed.

It should be understood that although this disclosure uses terms such as "first," "second," "third," etc., the disclosure should not be limited by or to these terms. These terms are used only to distinguish similar types of information from each other. For example, without departing from the scope of this disclosure, a first information can also be referred to as a second information; and similarly, a second information can also be referred to as a first information. Depending on the context, the word "if" as used herein can be interpreted as "when," "while," or "in response to."

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation as is permitted under the law so as to encompass all such modifications and equivalent arrangements.

What is claimed is:

1. A method of optimizing a mask used to produce a design pattern, the method comprising:
   generating a mask image for the mask;
   biasing the mask image to obtain a biased mask image by updating at least one pixel of the mask image using an interpolation of neighboring pixels of the at least one pixel, the interpolation being dependent on a predetermined value relating to a bias value; and
   simulating the biased mask image to obtain a wafer image to be compared to the design pattern.

2. The method of claim 1, wherein the interpolation is based on a Taylor expansion.

3. The method of claim 2, wherein the Taylor expansion is a first order Taylor expansion.

4. The method of claim 2, further comprising performing the Taylor expansion with respect to the predetermined value.

5. The method of claim 1, wherein the neighboring pixels comprise non-integer pixel locations.

6. The method of claim 1, wherein the neighboring pixels are defined by a size of a Hamming-sinc filter.

7. The method of claim 1, wherein the predetermined value is a bias value corresponding to an error by an ebeam machine for use in producing the mask.

8. An apparatus for optimizing a mask used to produce a design pattern, the apparatus comprising:
   a processor system; and
   a memory configured to store instructions executable by the processor system, the instructions, upon execution by the processor system, configured to cause the processor system to at least:
      generate a mask image for the mask;
      bias the mask image to obtain a biased mask image by updating at least one pixel of the mask image using an interpolation of neighboring pixels of the at least one pixel, the interpolation being dependent on a predetermined value relating to a bias value; and
      simulate the biased mask image to obtain a wafer image to be compared to the design pattern.

9. The apparatus of claim 8 . . . wherein the interpolation is based on a Taylor expansion.

10. The apparatus of claim 9, wherein the Taylor expansion is a first order Taylor expansion.

11. The apparatus of claim 9, wherein the instructions are further configured to cause the processor system to perform the Taylor expansion with respect to the predetermined value.

12. The apparatus of claim 8, wherein the neighboring pixels comprise non-integer pixel locations.

13. The apparatus of claim 8, wherein the neighboring pixels are defined by a size of a Hamming-sinc filter.

14. The apparatus of claim 8, wherein the predetermined value is a bias value corresponding to an error by an ebeam machine for use in producing the mask.

15. A non-transitory computer-readable storage medium, comprising instructions therein, which instructions, when executed by a processor system, are configured to cause the processor system to at least:
   generate a mask image for a mask to be used to produce a design pattern;
   bias the mask image to obtain a biased mask image by updating at least one pixel of the mask image using an interpolation of neighboring pixels of the at least one pixel, the interpolation being dependent on a predetermined value relating to a bias value; and
   simulate the biased mask image to obtain a wafer image to be compared to the design pattern.

16. The non-transitory computer-readable storage medium of claim 15, wherein the interpolation is based on a Taylor expansion.

17. The non-transitory computer-readable storage medium of claim 16, wherein the Taylor expansion is a first order Taylor expansion.

18. The non-transitory computer-readable storage medium of claim 15, wherein the neighboring pixels comprise non-integer pixel locations.

19. The non-transitory computer-readable storage medium of claim 15, wherein the neighboring pixels are defined by a size of a Hamming-sinc filter.

20. The non-transitory computer-readable storage medium of claim 15, wherein the predetermined value is a bias value corresponding to an error by an ebeam machine for use in producing the mask.

* * * * *